(12) United States Patent
Lee

(10) Patent No.: US 9,082,758 B2
(45) Date of Patent: Jul. 14, 2015

(54) SEMICONDUCTOR APPARATUS AND SEMICONDUCTOR SYSTEM USING THE SAME

(71) Applicant: SK hynix Inc., Icheon-si Gyeonggi-do (KR)

(72) Inventor: Tae Yong Lee, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/081,647

(22) Filed: Nov. 15, 2013

(65) Prior Publication Data
US 2015/0041989 A1 Feb. 12, 2015

(30) Foreign Application Priority Data

Aug. 9, 2013 (KR) ........................ 10-2013-0094570

(51) Int. Cl.
*H01L 23/50* (2006.01)
*H01L 23/48* (2006.01)

(52) U.S. Cl.
CPC ..... *H01L 23/481* (2013.01); *H01L 2224/14181* (2013.01); *H01L 2224/16145* (2013.01)

(58) Field of Classification Search
USPC ................. 257/685, 686, E25.006, E25.021, 257/E25.027, E23.085, 621, 777, E25.013, 257/E23.141
See application file for complete search history.

(56) References Cited

U.S. PATENT DOCUMENTS

| 8,098,508 | B2 | 1/2012 | Janzen | |
|---|---|---|---|---|
| 8,693,277 | B2 * | 4/2014 | Hayashi | 365/230.03 |
| 2010/0109096 | A1 * | 5/2010 | Osada et al. | 257/401 |
| 2013/0021866 | A1 * | 1/2013 | Lee | 365/230.01 |

FOREIGN PATENT DOCUMENTS

KR 1020110099384 A 9/2011

* cited by examiner

*Primary Examiner* — Jasmine Clark
(74) *Attorney, Agent, or Firm* — William Park & Associates Ltd.

(57) ABSTRACT

A semiconductor apparatus includes first and second through vias, a first path setting unit, and a second path setting unit. The first and second through vias connect first and second chips. The first path setting unit connects a first chip circuit to a first input/output terminal, and the second through via to a second input/output terminal. The second path setting unit connects a second chip circuit to the first through via and the second through via, wherein the first through via is connected to the second input/output terminal.

24 Claims, 6 Drawing Sheets

SEMICONDUCTOR APPARATUS AND SEMICONDUCTOR SYSTEM USING THE SAME

CROSS-REFERENCES TO RELATED APPLICATION

The present application claims priority under 35 U.S.C. §119(a) to Korean application number 10-2013-0094570, filed on Aug. 9, 2013, in the Korean Intellectual Property Office, which is incorporated herein by reference in its entirety as set forth in full.

BACKGROUND

1. Technical Field

Various embodiments relate to a semiconductor apparatus, and more particularly, to a 3D (three-dimensional) semiconductor apparatus in which a plurality of chips are stacked, and a semiconductor system using the same.

2. Related Art

In order to elevate the degree of integration of a semiconductor apparatus, there has been developed a three-dimensional (3D) semiconductor apparatus in which a plurality of chips are stacked and packaged in a single package. Recently, a TSV (through-silicon via) type semiconductor apparatus has been disclosed in the art, in which silicon vias are formed through a plurality of stacked chips so that all the chips are electrically coupled with one another.

In order to use power with a low level and reduce power consumption, a wide input/output (IO) semiconductor apparatus having an increased input/output number has been developed. The wide IO semiconductor apparatus uses a scheme in which the number of input/output lines or terminals is significantly increased to lower an operational frequency and increase a bandwidth thereof.

FIG. 1 is a diagram schematically illustrating the configuration of a semiconductor apparatus 10 according to the conventional art. In FIG. 1, the semiconductor apparatus 10 may include first and second chips CHIP1 and CHIP2. The first and second chips CHIP1 and CHIP2 include first and second through vias 11 and 12 and input/output circuits I/O, respectively. The first and second through vias 11 and 12 extend through the first and second chips CHIP1 and CHIP2 to electrically couple the first and second chips CHIP1 and CHIP2 to each other through bumps 13, respectively. The input/output circuits I/O are electrically coupled to the first and second through vias 11 and 12, respectively. Signals inputted to first and second input/output terminals DQ<0> and DQ<1> may be inputted to internal circuits of the first and second chips CHIP1 and CHIP2 through the first and second through vias 11 and 12, respectively. Data outputted from the first and second chips CHIP1 and CHIP2 may be outputted to the first and second input/output terminals DQ<0> and DQ<1> through the first and second through vias 11 and 12, respectively.

The semiconductor apparatus 10 has a structure in which all signal lines including the through vias are short-circuited, and has a fixed number of input/output lines or terminals. That is, input/output circuits I/O of the first and second chips, which are electrically coupled to the same through via, may not simultaneously operate. Furthermore, the semiconductor apparatus 10 does not have a redundancy through via for signal path repair when the through via or the bump has failed.

FIG. 2 is a diagram schematically illustrating the configuration of another semiconductor apparatus 20 according to the conventional art. In FIG. 2, the semiconductor apparatus 20 may include first and second chips CHIP1 and CHIP2, wherein the first chip CHIP1 may include first and second through vias 21 and 22, and an input/output circuit I/O, and the second chip CHIP2 may include third and fourth through vias 23 and 24, and an input/output circuit I/O. The semiconductor apparatus 20 has a structure capable of increasing the number of input/output lines or terminals.

The first and second through vias 21 and 22 electrically couple the first and second chips CHIP1 and CHIP2 to each other through bumps 25, respectively. The third through via 23 is electrically coupled to the second through via 22, and the second via 22 is electrically coupled to a first input/output terminal DQ1<0> through the input/output circuit I/O of the first chip CHIP1. The fourth through via 24 is electrically coupled to the first through via 21 and the input/output circuit I/O of the second chip CHIP2, and is electrically coupled to a second input/output terminal DQ2<0> through the first through via 21. Since the semiconductor apparatus 20 has independent signal paths for the input/output circuits I/O of the first and second chips CHIP1 and CHIP2, it is possible to increase the number of input/output lines or terminals twice as compared with that of the semiconductor apparatus 10 of FIG. 1. However, as illustrated in FIG. 2, the signal path from the third through via 23 to the second through via 22 is not utilized.

SUMMARY

A semiconductor apparatus capable of stably transmitting a signal by forming a plurality of signal paths even though a through via or a bump is failed is described herein.

In an embodiment of the present invention, a semiconductor apparatus includes: first and second through vias configured to electrically couple first and second chips; a first path setting unit configured to electrically couple a first chip circuit to a first input/output terminal and electrically couple the second through via to a second input/output terminal; and a second path setting unit configured to electrically couple a second chip circuit to the first and second through vias, wherein the first through via is electrically couple to the second input/output terminal.

In an embodiment of the present invention, a semiconductor apparatus includes: a first chip including first to third through vias, a first path control unit configured to be electrically couple to the third through via and generate a first selection signal in response to a control signal, and a first path setting unit configured to electrically couple a first chip circuit to a first input/output terminal and the second through via to a second input/output terminal, wherein the first through via is electrically couple to the second input/output terminal.

In an embodiment of the present invention, a semiconductor apparatus includes: a plurality of through vias configured to electrically couple first and second chips; a transmission path setting unit configured in the second chip to transmit a signal generated in a second chip circuit to two or more through vias of the plurality of through vias; and a reception path setting unit configured in the first chip, to output a signal generated in the first chip circuit to a first input/output terminal, receive the signal generated in the second chip circuit from the two or more through vias, and output the received signal to a second input/output terminal.

In an embodiment of the present invention, a semiconductor apparatus includes: a plurality of through vias configured to electrically couple first and second chips; a transmission path control unit configured in the first chip, to transmit a signal inputted to a first input/output terminal to a first chip circuit, and transmit a signal inputted to a second input/output terminal to two or more through vias of the plurality of through vias; and a reception path control unit configured in the second chip, to receive the signal from the two or more through vias, and transmit the received signal to a second chip circuit.

In an embodiment of the present invention, a semiconductor apparatus includes: a first path setting unit configured in a first chip to electrically couple a first chip circuit to a first input/output terminal and a second through via to the first input/output terminal; and a second path setting unit configured in a second chip to connect the second chip to a first through via and the second through via.

BRIEF DESCRIPTION OF THE DRAWINGS

Features, aspects, and embodiments are described in conjunction with the attached drawings, in which.

DETAILED DESCRIPTION

Hereinafter, a semiconductor apparatus and a semiconductor system using the same according to the present invention will be described in detail with reference to the accompanying drawings through an embodiment.

Figure 1:
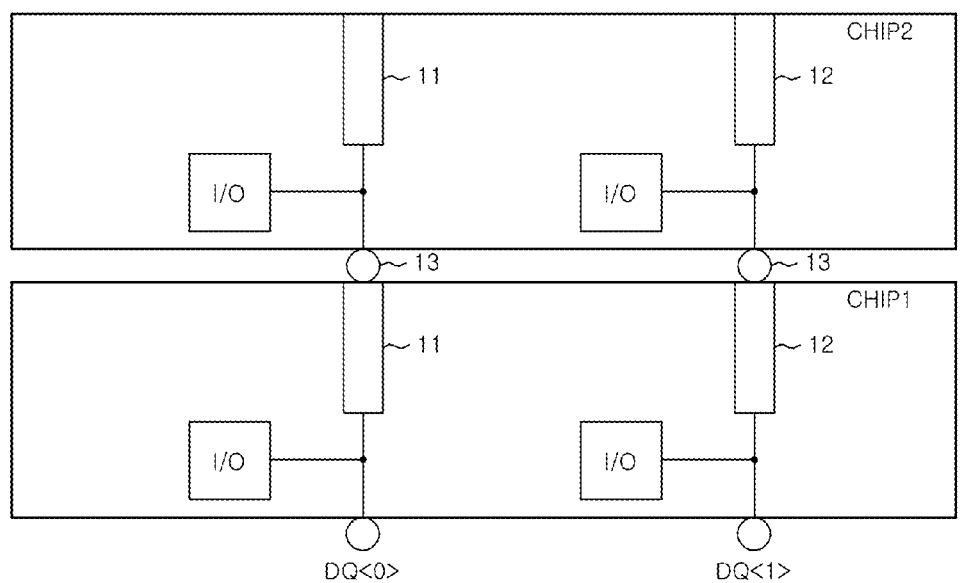
FIG. 1 is a diagram schematically illustrating the configuration of a semiconductor apparatus according to the conventional art.
Figure 2:
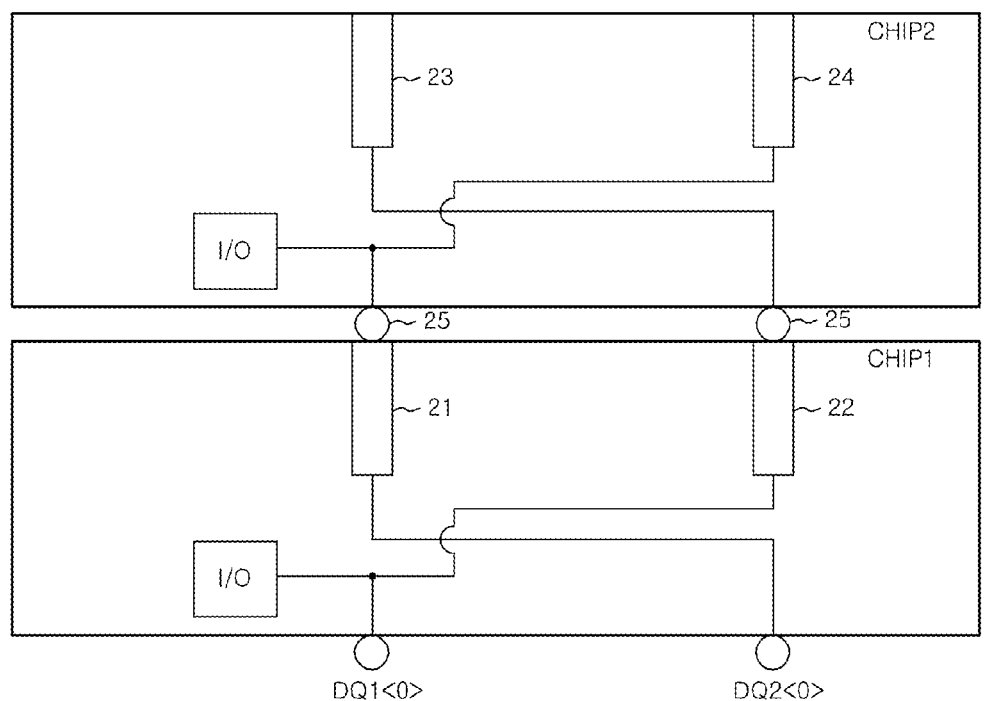
FIG. 2 is a diagram schematically illustrating the configuration of another semiconductor apparatus according to the conventional art.
Figure 3:
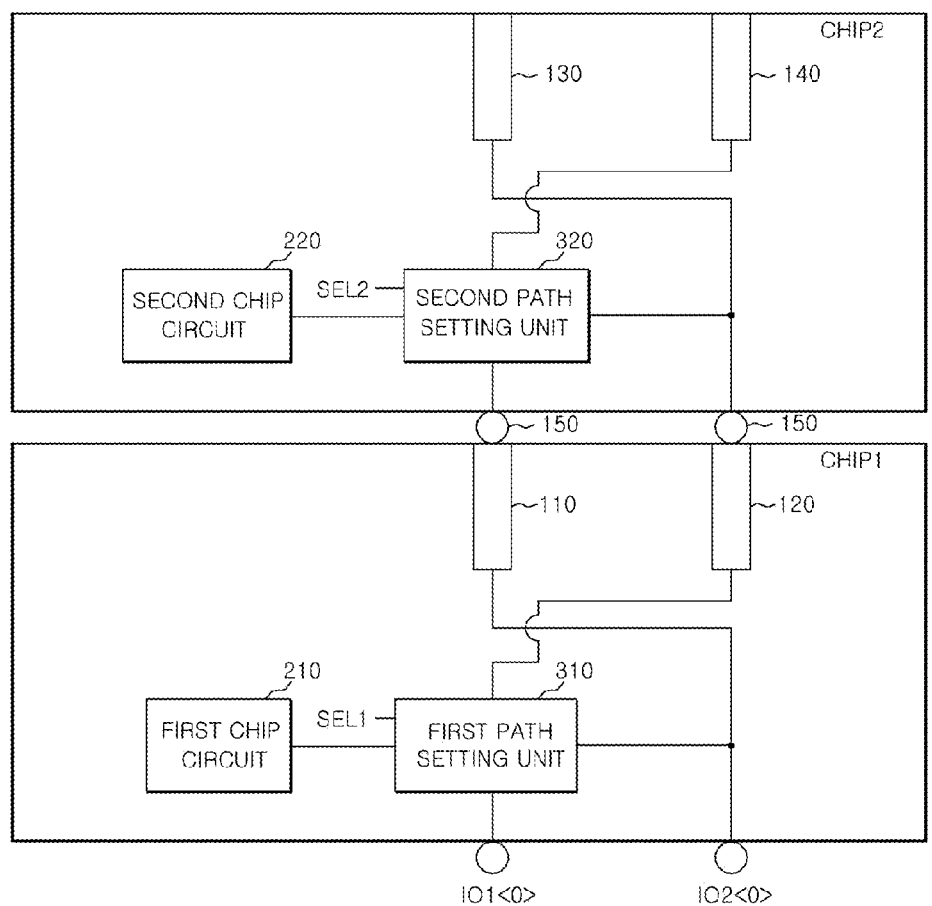
FIG. 3 is a diagram schematically illustrating the configuration of a semiconductor apparatus according to an embodiment.

In FIG. 3, a semiconductor apparatus 1 may include first and second chips CHIP1 and CHIP2. The first and second chips CHIP1 and CHIP2 may be stacked to constitute a single semiconductor apparatus. That is, the first and second chips CHIP1 and CHIP2 may be packaged in a single package.

The semiconductor apparatus 1 may include a first through via 110, a second through via 120, a first chip circuit 210, a second chip circuit 220, a first path setting unit 310, a second path setting unit 320, a first input/output terminal IO1<0>, and a second input/output terminal IO2<0>. The first and second through vias 110 and 120 may be formed through the first chip CHIP1, and electrically couple the first and second chips CHIP1 and CHIP2 to each other through bumps 150, respectively. The first through via 110 may be electrically coupled to the second input/output terminal IO2<0>.

The first chip circuit 210 may be provided in order to output a signal generated in the first chip CHIP1, or to transfer a signal inputted from an exterior to an internal circuit of the first chip CHIP1. Similarly, the second chip circuit 220 may be provided in order to output a signal generated in the second chip circuit 220, or to transfer a signal inputted from an exterior to an internal circuit of the second chip circuit 220. For example, the first and second chip circuits 210 and 220 may include a data input/output circuit. However, the first and second chip circuits 210 and 220 are not limited thereto. For example, the first and second chip circuits 210 and 220 may include all circuits, which are used when the semiconductor apparatus 1 communicates with an exterior, such as command buffers, clock buffers, or data strobe buffers.

The first path setting unit 310 may be provided in the first chip CHIP1. The first path setting unit 310 may electrically couple the first chip circuit 210 to the first input/output terminal IO1<0>, and electrically couple the second through via 120 to the first input/output terminal IO1<0>. In response to a first selection signal SEL1, the first path setting unit 310 may interrupt an electrical coupling between the first chip circuit 210 and the second input/output terminal IO2<0>, and may electrically couple the second through via 120 to the second input/output terminal IO2<0>. Consequently, the first path setting unit 310 may form a signal path between the first chip circuit 210 and the first input/output terminal IO1<0>, and form a signal path between the second through via 120, as well as the first through via 110, and the second input/output terminal IO2<0>.

The second path setting unit 320 may be provided in the second chip CHIP2. The second path setting unit 320 may electrically couple the second chip CHIP2 to the first and second through vias 110 and 120. The second path setting unit 320 may electrically couple the second chip circuit 220 to the first through via 110, and electrically couple the second chip circuit 220 to the second through via 120 in response to a second selection signal SEL2. Consequently, the second path setting unit 320 may form signal paths between the second chip circuit 220 and the first and second through vias 110 and 120. As described below, the first and second selection signals SEL1 and SEL2 may be generated in the semiconductor apparatus 1. In one embodiment, the semiconductor device 1 may receive the first and second selection signals SEL1 and SEL2 from external controller which may include processor and controller.

In FIG. 3, the second chip CHIP2 may further include third and fourth through vias 130 and 140. The third and fourth through vias 130 and 140 may be formed through the second chip CHIP2. When there are no other chips stacked with the second chip CHIP2 except for the first chip CHIP1, the third and fourth through vias 130 and 140 may not form another electrical coupling except for the second chip circuit 220 and the second path setting unit 320. The third through via 130 may be electrically coupled to the second through via 120, and the second path setting unit 320 may interrupt a connection between the fourth through via 140 and the second through via 120 in response to the second selection signal SEL2. The first and second chips CHIP1 and CHIP2 constituting the semiconductor apparatus 1 may be fabricated on substantially the same wafer with substantially the same structure in order to reduce the fabricating cost. Accordingly, in an embodiment, the first and second chips CHIP1 and CHIP2 have substantially the same structure. However, during the stacking, elements of the first and second chips CHIP1 and CHIP2 may have different electrical coupling structures and perform different operations.

The first and second input/output terminals IO1<0> and IO2<0> may be provided to allow the semiconductor apparatus 1 to communicate with an exterior. The first and second input/output terminals IO1<0> and IO2<0> may be directly electrically coupled with a processor, or may be electrically coupled with the processor through a logic die and a controller. The first and second input/output terminals IO1<0> and IO2<0> may be provided to output signals generated in the first and second chips CHIP1 and CHIP2 to an exterior, or to receive signals inputted from an exterior.

When signals are outputted from the semiconductor apparatus 1 to an exterior, the first path setting unit 310 may serve as a reception path control unit and the second path setting unit 320 may serve as a transmission path control unit. A signal generated in the first chip circuit 210 may be outputted to the first input/output terminal IO1<0>. A signal generated in the second chip circuit 220 may be transmitted to the first chip CHIP1 through the second path setting unit 320 and the first and second through vias 110 and 120. The signal transmitted through the first through via 110 may be outputted to the second input/output terminal IO2<0>, and the first path setting unit 310 may output the signal transmitted through the second through via 120 to the second input/output terminal IO2<0>. As described above, the semiconductor apparatus 1 may form two or more signal transmission paths in the case of transmitting a signal generated in the second chip CHIP2 to the first chip CHIP1. Consequently, even though one signal path is failed due to failure of one of the first and second through vias 110 and 120 and the bumps 150 that electrically couple the first and second through vias 110 and 120 to the second chip CHIP2, it may be possible to transmit the signal generated in the second chip CHIP2 to the first chip CHIP1 through the other signal path.

When signals are inputted to the semiconductor apparatus 1 from an exterior, the first path setting unit 310 may serve as a transmission path control unit and the second path setting unit 320 may serve as a reception path control unit. A signal inputted to the first input/output terminal IO1<0> may be transmitted to the first chip circuit 210. A signal inputted to the second input/output terminal IO2<0> may be transmitted to the first through via 110, and may be transmitted to the second through via 120 through the first path setting unit 310. The second path setting unit 320 may transmit a signal transmitted through the first through via 110 to the second chip circuit 220, and may transmit a signal transmitted through the second through via 120 to the second chip circuit 220. As described above, the semiconductor apparatus 1 may form two or more signal paths in the case of transmitting a signal inputted to the second input/output terminal IO2<0> from the first chip CHIP1 to the second chip CHIP2. Consequently, even though one signal path is failed due to failure of one of the first and second through vias 110 and 120 and the bumps 150 that electrically couple the first and second through vias 110 and 120 to the second chip CHIP2, it may be possible to transmit a signal inputted to the second input/output terminal IO2<0> from the first chip CHIP1 to the second chip CHIP2 through the other signal path.

Figure 4:
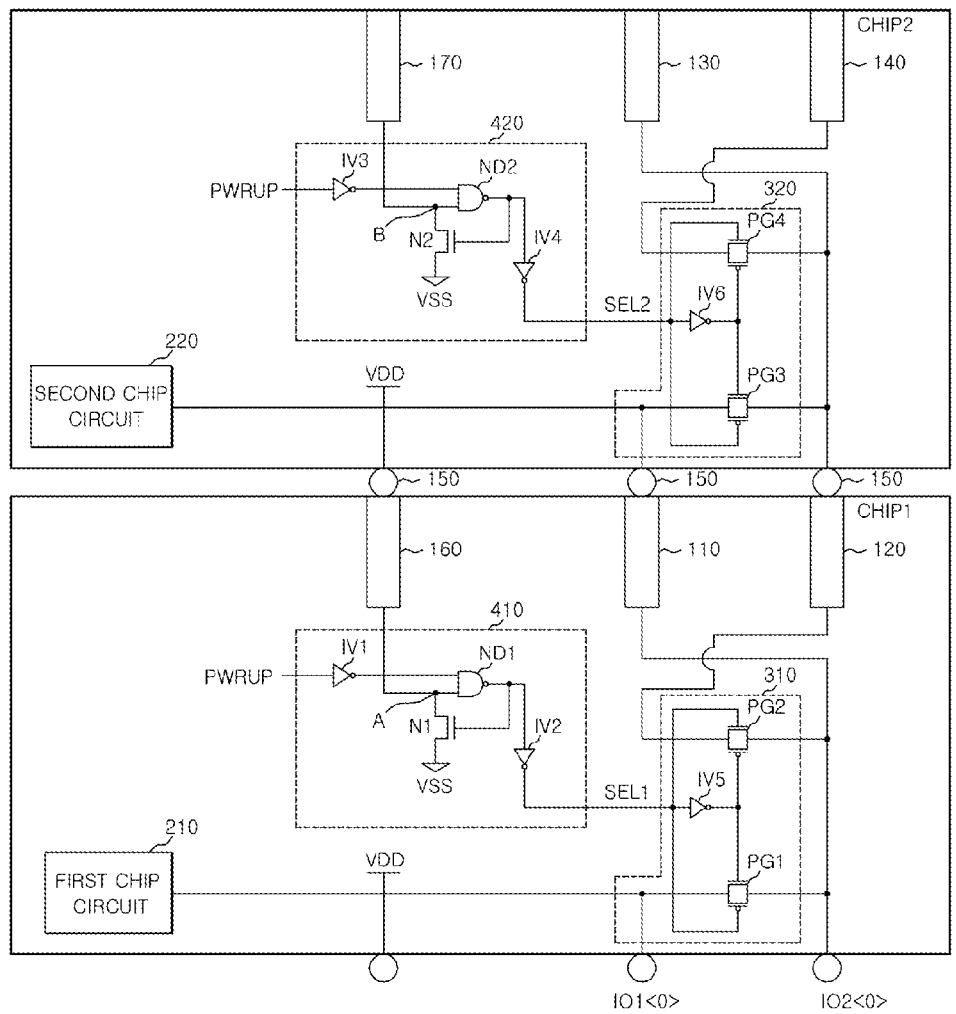
FIG. 4 is a diagram illustrating a detailed configuration of a semiconductor apparatus according to an embodiment.

FIG. 4 is a diagram illustrating a detailed configuration of a semiconductor apparatus 2 according to an embodiment. In FIG. 4, the semiconductor apparatus 2 may further include a fifth through via 160, a sixth through via 170, a first path control unit 410, and a second path control unit 420. The fifth through via 160 may be provided in the first chip CHIP1 and electrically couple the first and second chips CHIP1 and CHIP2 to each other through the bump 150. The fifth through via 160 may be electrically coupled to a power supply voltage VDD terminal of the second chip CHIP2. The sixth through via 170 may be provided in the second chip CHIP2. Since the second chip CHIP2 is not stacked with another chip, the sixth through via 170 may not receive the power supply voltage VDD as with the fifth through via 160.

In FIG. 4, the first path control unit 410 may be electrically coupled to the fifth through via 160, and generate the first selection signal SEL1 in response to a control signal PWRUP. The first path control unit 410 may receive the power supply voltage VDD through the fifth through via 160, and generate the first selection signal SEL1 in response to the power supply voltage VDD and the control signal PWRUP. The control signal PWRUP may use a signal for initializing the semiconductor apparatus 2, and for example, may include a power-up signal. The power-up signal may be enabled to a first level and then is disabled to a second level when power is supplied to the semiconductor apparatus 2 and a power level is stabilized. The first path control unit 410 may generate the first selection signal SEL1 at a first level in response to the power supply voltage VDD and the control signal PWRUP. In an embodiment, the first level may be a high level and the second level may be a lower level.

The second path control unit 420 may be electrically coupled to the sixth through via 170, and generate the second selection signal SEL2 in response to the control signal PWRUP. Since the sixth through via 170 does not receive the power supply voltage VDD as with the fifth through via 160, the second path control unit 420 may generate the second selection signal SEL2 in response to the control signal PWRUP. Consequently, even though the second path control unit 420 has substantially the same configuration as that of the first path control unit 410, the second path control unit 420 may generate the second selection signal SEL2 at the second level opposite to that of the first selection signal SEL1.

The first path control unit 410 may include a first inverter IV1, a first NMOS transistor N1, a first NAND gate ND1, and a second inverter IV2. The first inverter IV1 may invert the control signal PWRUP. The first NMOS transistor N1 has a gate that may be electrically coupled to an output terminal of the first NAND gate ND1, and a drain that may be electrically coupled to a first node A. The first node A may be commonly electrically coupled to the fifth through via 160, the drain of the first NMOS transistor N1, and an input terminal of the first NAND gate ND1. Accordingly, the first NMOS transistor N1 may receive the power supply voltage VDD through the drain thereof. A source of the first NMOS transistor N1 may be electrically coupled to a ground voltage VSS. The first NAND gate ND1 may receive the output of the first inverter IV1 and may be electrically coupled to the first node A. The second inverter IV2 may invert the output of the first NAND gate ND1 and generate the first selection signal SEL1. When the control signal PWRUP may be disabled to a second level, the first inverter IV1 may output a signal at the first level. When the external voltage VDD is applied, the first node A has the first level. Accordingly, the first NAND gate ND1 may output a signal at the second level. The second inverter IV2 may invert the signal at the second level and generate the first selection signal SEL1 having the first level.

The second path control unit 420 may have substantially the same configuration as that of the first path control unit 410. The second path control unit 420 may include a third inverter IV3, a second NMOS transistor N2, a second NAND gate ND2, and a fourth inverter IV4. The second path control unit 420 may have substantially the same configuration and electrical coupling relation as those of the first path control unit 410, but may be different from the first path control unit 410 in that the power supply voltage VDD may not be applied to a second node B. Consequently, the second NAND gate ND2 may output a signal at the first level, and the fourth inverter IV4 may invert the signal at the first level and generate the second selection signal SEL2 at the second level.

In FIG. 4, the first path setting unit 310 may include a fifth inverter IV5, and first and second pass gates PG1 and PG2. The fifth inverter IV5 may invert the first selection signal SEL1. The first pass gate PG1 may electrically couple the first chip circuit 210 to the second input/output terminal IO2<0> in response to the first selection signal SEL1. The first pass gate PG1 may receive the first selection signal SEL1 through a PMOS terminal thereof, and receive the output (that is, an inverted signal of the first selection signal SEL1) of the fifth inverter IV5 through a NMOS terminal thereof. The second pass gate PG2 may electrically couple the second through via 120 to the second input/output terminal IO2<0> in response to the first selection signal SEL1. The second pass gate PG2 may receive the output of the fifth inverter IV5 through a PMOS terminal thereof, and receive the first selection signal SEL1 through a NMOS terminal thereof. Accordingly, in response to the first selection signal SEL1 having the first level, the first pass gate PG1 may be turned off and the second pass gate PG2 may be turned on. The first path setting unit 310 may interrupt an electrical coupling between the first chip circuit 210 and the second input/output terminal IO2<0> and may electrically couple the second through via 120 to the second input/output terminal IO2<0>. Consequently, a signal path, through which the second input/output terminal IO2<0> is electrically coupled to the first through via 110, and a signal path, through which the second input/output terminal IO2<0> is electrically coupled to the second through via 120, may be formed.

The second path setting unit 320 may include a sixth inverter IV6, and third and fourth pass gates PG1 and PG2. The sixth inverter IV6 may invert the second selection signal SEL2. The third pass gate PG3 may electrically couple the second chip circuit 220 to the second through via 120 in response to the second selection signal SEL2. The third pass gate PG3 may receive the second selection signal SEL2 through a PMOS terminal thereof, and receive the output (that is, an inverted signal of the second selection signal SEL2) of the sixth inverter IV6 through a NMOS terminal thereof. The fourth pass gate PG4 may electrically couple the fourth through via 140 to the second through via 120 in response to the second selection signal SEL2. The fourth pass gate PG4 may receive the output of the sixth inverter IV6 through a PMOS terminal thereof, and receive the second selection signal SEL2 through a NMOS terminal thereof. Accordingly, in response to the second selection signal SEL2 having the second level, the third pass gate PG3 may be turned on and the fourth pass gate PG4 may be turned off. The second path setting unit 320 may electrically couple the second chip circuit 220 to the second through via 120, and may interrupt a electrical coupling between the fourth through via 140 and the second through via 120. Consequently, a signal path, through which the first through via 110 is electrically coupled to the second chip circuit 220, and a signal path, through which the second through via 120 is electrically coupled to the second chip circuit 220, may be formed.

The first and second chips CHIP1 and CHIP2 constituting the semiconductor apparatus 2 may have substantially the same structure. However, when the first and second chips CHIP1 and CHIP2 have been stacked, the first and second path control units 410 and 420 may generate the first and second selection signals SEL1 and SEL2 having levels different from each other, respectively. Consequently, the first and second through vias 110 and 120, which electrically couple the first and second chips CHIP1 and CHIP2 to each other, may electrically couple the second chip circuit 220 to the second input/output terminal IO2<0>, so that it is possible to form a plurality of signal paths through which a signal outputted from the second chip circuit 220 is transmitted to the second input/output terminal IO2<0>, or a plurality of signal paths through which a signal inputted to the second input/output terminal IO2<0> is transmitted to the second chip circuit 220. Consequently, the semiconductor apparatus 2 according to an embodiment may be able to stably transmit a signal without an additional redundancy circuit and operation even though one of the plurality of signal paths is failed.

Figure 5:
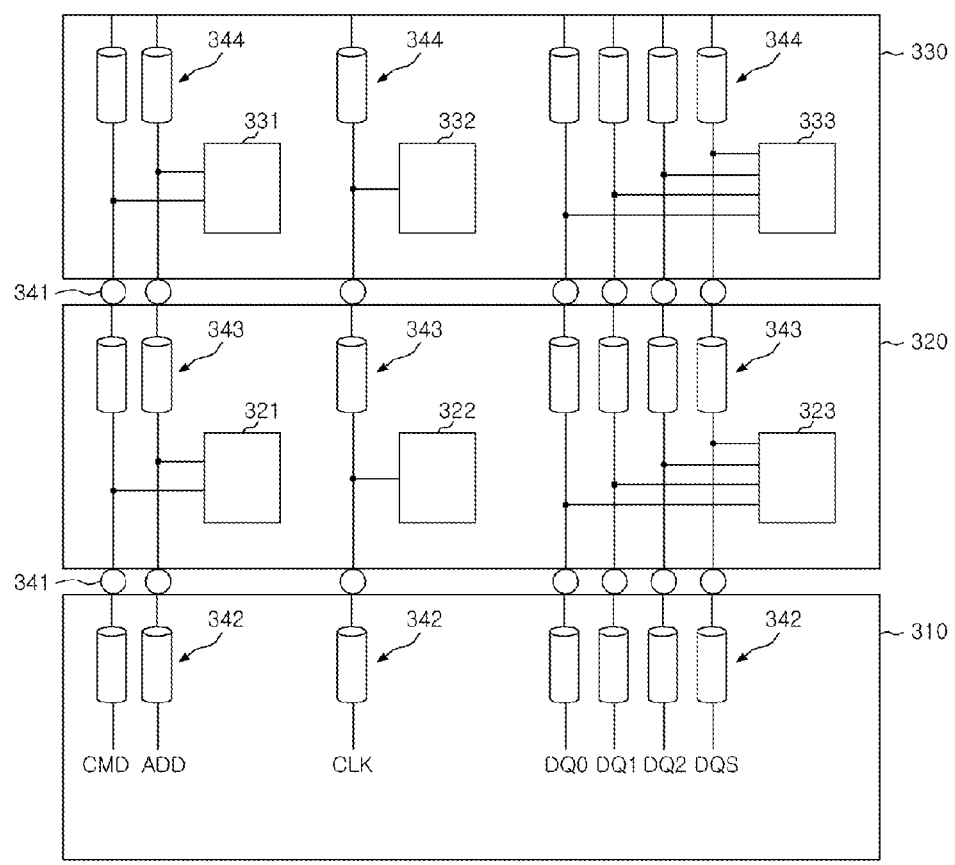
FIG. 5 is a diagram illustrating a configuration of a semiconductor system according to an embodiment.

FIG. 5 is a diagram illustrating a configuration of a semiconductor system 3 according to an embodiment. In FIG. 5, the semiconductor system 3 may include one or more base dies and a plurality of stacked dies. FIG. 5 illustrates the structure in which one base die 310 and two stacked dies 320 and 330 may have been stacked. The base die 310 may perform a function of a logic chip, and for example, may include a processor or a controller. The stacked dies 320 and 330 may perform a function of a slave chip, and for example, may include a memory. The stacked dies 320 and 330 may include the aforementioned semiconductor apparatuses 1 and 2 according to an embodiment.

The base die 310 and the stacked dies 320 and 330 may be stacked with each other through bumps 341, and may be packaged in a single package to constitute a system on chip (SoC) or a system in package (SIP). The base die 310 may provide the stacked dies 320 and 330 with a command signal CMD, an address signal ADD, a clock signal CLK, data DQ0 to DQ2, and a data strobe signal DQS. The base die 310 may transmit the signals to the stacked dies 320 and 330 through through vias 342 formed therein.

The first stacked die 320 may receive the command signal CMD, the address signal ADD, the clock signal CLK, the data DQ0 to DQ2, the data strobe signal DQS and the like from the base die 310 through the bumps 341, and may perform a data input/output operation in response to signals transmitted from the base die 310. The first stacked die 320 may include a command and address buffer 321, a clock buffer 322, and a data buffer 323 to receive the signals transmitted from the base die 310. The first stacked die 320 may output the data DQ0 to DQ2 and the data strobe signal DQS to the base die 310 through the data buffer 323 in the data output operation. Furthermore, the first stacked die 320 may be electrically coupled to the second stacked die 330 through through vias 343 formed therein.

The second stacked die 330 may be electrically coupled to the first stacked die 320 through the bumps 341, and may be electrically coupled to the base die 310 through the first stacked die 320. The second stacked die 330 may receive the command signal CMD, the address signal ADD, the clock signal CLK, the data DQ0 to DQ2, the data strobe signal DQS and the like, which are transmitted through the base die 310 and the first stacked die 320, and may perform a data input/output operation. The second stacked die 330 may include a command and address buffer 331, a clock buffer 332, and a data buffer 333 to receive the signals. Furthermore, the second stacked die 330 may output the data DQ0 to DQ2 and the data strobe signal DQS to the first stacked die 320 through the data buffer 333 in the data output operation, and the data DQ0 to DQ2 and the data strobe signal DQS outputted from the second stacked die 330 may be transmitted to the base die 310 through the through vias 343 formed through the first stacked die 320. The second stacked die 330 may be formed therein with through vias 344 and may be stacked with another chip through the through vias 344.

Figure 6:
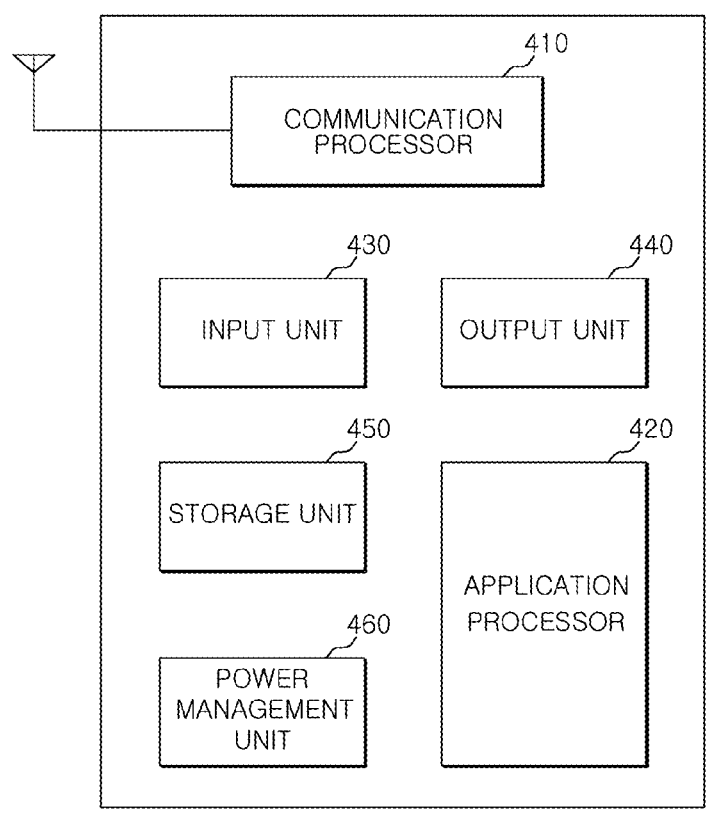
FIG. 6 is a diagram schematically illustrating a configuration of a semiconductor system according to an embodiment.

FIG. 6 is a diagram schematically illustrating a configuration of a system 4 according to an embodiment. In FIG. 6, the system 4 may be utilized in a cell phone, a personal communication system (PCS) device, a personal digital assistant (PDA) device, a portable GPS device, a tablet computer and the like, and may also be utilized in a PC, a desk top computer, a laptop computer, a notebook computer, a server computer and the like. In FIG. 6, the system 4 may include a communication processor 410, an application processor 420, an input unit 430, an output unit 440, a storage unit 450, and a power management unit 460. The communication processor 410 may input/output a signal through one or more radio communication links. The radio communication link, for example, may include a radio channel, an IR (infrared communication) channel, an RF (radio frequency communication) channel, a WiFi channel and the like.

The application processor 420, for example, may include a central processing unit (CPU), a digital signal processor (DSP), one or more core processors, a microprocessor, a host processor, a controller, an integrated circuit (IC), an application specific integrated circuit (ASIC) and the like. The application processor 420 performs an operation system (OS) or one or more applications of the system 4. Particularly, the application processor 420 may include the semiconductor apparatuses 1 and 2 according to an embodiment. Furthermore, the application processor 420 may include the configuration of the semiconductor system illustrated in FIG. 5, and may be implemented with a system on chip (SOC) or a system in package (SIP) in which a processor/a controller and a memory are have been stacked.

The input unit 430 may include a keyboard, a keypad, a mouse, a touchpad, a microphone, a digital camera and the like, and the output unit 440 may include a monitor, a screen, an LCD device, an audio, a speaker, an earphone, a Bluetooth (or a hands-free) speaker and the like. The storage unit 450 may include a nonvolatile memory such as a FLASH memory, a Phase Change random-access memory (PCRAM), a resistive random-access memory (ReRAM), a Ferroelectric random-access memory (FeRAM), a magnetoresistive random-access memory (MRAM), or a Spin-transfer torque random-access memory (STTRAM), and may store data desired by a user.

The power management unit 460 may manage power of each device constituting the system 4 such that the power of a battery can be efficiently used. Particularly, in a low power operation mode such as a standby mode, a sleep mode, a power-down mode, or a deep power-down mode, it is possible to minimize power that is consumed in the application processor 420 and the output unit 440.

While certain embodiments have been described above, it will be understood to those skilled in the art that the embodiments described are by way of example only. Accordingly, the semiconductor apparatus and the semiconductor system using the same described herein should not be limited based on the described embodiments. Rather, the semiconductor apparatus and the semiconductor system using the same described herein should only be limited in light of the claims that follow when taken in conjunction with the above description and accompanying drawings.

What is claimed is:

1. A semiconductor apparatus comprising:
    first and second through vias configured to electrically couple first and second chips;
    a first path setting unit configured to electrically couple a first chip circuit to a first input/output terminal and the second through via to a second input/output terminal; and
    a second path setting unit configured to electrically couple a second chip circuit to the first and second through vias,
    wherein the first through via is electrically coupled to the second input/output terminal.

2. The semiconductor apparatus according to claim 1, wherein the first path setting unit is configured to interrupt an electrical coupling between the first chip circuit and the second input/output terminal in response to a first selection signal.

3. The semiconductor apparatus according to claim 2, wherein the first path setting unit is configured to control an electrical coupling between the second through via and the second input/output terminal in response to the first selection signal.

4. The semiconductor apparatus according to claim 3, wherein the first path setting unit comprises:
    a first pass gate configured to electrically couple the first chip circuit to the second input/output terminal in response to the first selection signal; and
    a second pass gate configured to electrically couple the second through via to the second input/output terminal in response to the first selection signal.

5. The semiconductor apparatus according to claim 1, wherein the second path setting unit is configured to electrically couple the second chip circuit to the second through via in response to a second selection signal.

6. The semiconductor apparatus according to claim 5, further comprising:
    third and fourth through vias formed through the second chip,
    wherein the third through via is electrically coupled to the second through via, and the second path setting unit is configured to interrupt an electrical coupling between the fourth through via and the second through via in response to the first selection signal.

7. The semiconductor apparatus according to claim 6, wherein the second path setting unit comprises:
    a third pass gate configured to selectively electrically selectively couple the second chip circuit to the second through via in response to the second selection signal; and
    a fourth pass gate configured to selectively electrically selectively couple the fourth through via to the second through via in response to the second selection signal.

8. A semiconductor apparatus comprising:
    a first chip including first to third through vias, a first path control unit configured to be electrically coupled to the third through via and generate a first selection signal in response to a control signal, and a first path setting unit configured to electrically couple a first chip circuit to a first input/output terminal and the second through via to a second input/output terminal,
    wherein the first through via is connected to the second input/output terminal.

9. The semiconductor apparatus according to claim 8, wherein the first path control unit is configured to receive a power supply voltage through the third through via, and generate the first selection signal at a first level in response to the power supply voltage and the control signal.

10. The semiconductor apparatus according to claim 9, wherein the first path setting unit is configured to interrupt an electrical coupling between the first chip circuit and the second input/output terminal and electrically couple the second through via to the second input/output terminal in response to the first selection signal.

11. The semiconductor apparatus according to claim 9, wherein the first path setting unit comprises:
    a first pass gate configured to selectively electrically couple the first chip circuit to the second input/output terminal in response to the first selection signal; and
    a second pass gate configured to selectively electrically couple the second through via to the second input/output terminal in response to the first selection signal.

12. The semiconductor apparatus according to claim 8, further comprising:
    a second chip including fourth to sixth through vias, a second path control unit configured to be electrically coupled to the sixth through via and generate a second selection signal in response to the control signal, and a second path setting unit configured to electrically couple a second chip circuit to the first through via and electrically couple the fifth through via to the second through via, wherein the fourth through via is electrically coupled to the second through via.

13. The semiconductor apparatus according to claim 12, wherein the second path control unit is configured to generate the second selection signal at a second level in response to the control signal.

14. The semiconductor apparatus according to claim 13, wherein the second path setting unit is configured to electrically couple the second chip circuit to the second through via and interrupt an electrical coupling between the fifth through via and the second through via in response to the second selection signal.

15. The semiconductor apparatus according to claim 14, wherein the second path setting unit comprises:
- a third pass gate configured to selectively electrically selectively couple the second chip circuit to the second through via in response to the second selection signal; and
- a fourth pass gate configured to selectively electrically selectively couple the fifth through via to the second through via in response to the second selection signal.

16. A semiconductor apparatus comprising:
- a plurality of through vias configured to electrically couple first and second chips;
- a transmission path setting unit configured in the second chip and to transmit a signal generated in a second chip circuit to two or more through vias of the plurality of through vias; and
- a reception path setting unit configured in the first chip, to output a signal generated in the first chip circuit to a first input/output terminal, receive the signal generated in the second chip circuit from the two or more through vias, and output the received signal to a second input/output terminal.

17. The semiconductor apparatus according to claim 16, wherein the reception path setting unit is configured to interrupt an electrical coupling between the first chip circuit and the second input/output terminal.

18. A semiconductor apparatus comprising:
- a plurality of through vias configured to electrically couple first and second chips;
- a transmission path control unit configured in the first chip, to transmit a signal inputted to a first input/output terminal to a first chip circuit, and a signal inputted to a second input/output terminal to two or more through vias of the plurality of through vias; and
- a reception path control unit configured in the second chip, to receive the signal from the two or more through vias, and transmit the received signal to a second chip circuit.

19. The semiconductor apparatus according to claim 18, wherein the transmission path control unit is configured to interrupt an electrical coupling between the first chip circuit and the second input/output terminal.

20. A semiconductor apparatus comprising:
- a first path setting unit configured in a first chip to electrical couple a first chip circuit to a first input/output terminal and a second through via to the first input/output terminal; and
- a second path setting unit configured in a second chip to electrical couple the second chip to a first through via and the second through via.

21. The semiconductor apparatus of claim 20, wherein the first path setting unit interrupts an electrical coupling between the first chip circuit and a second input/output terminal and couples the second through via to the second input/output terminal.

22. The semiconductor apparatus of claim 20, wherein the first path setting unit is configured as a reception path control unit and the second path setting unit is configured as a transmission path control unit when one or more signals are outputted from the semiconductor apparatus.

23. The semiconductor apparatus of claim 20, wherein the first path setting unit is configured as a transmission path control unit and the second path setting unit is configured as a reception path control unit when one or more signals are inputted to the semiconductor apparatus.

24. The semiconductor apparatus of claim 23, wherein two or more signal paths are formed when a signal is inputted to the second input/output terminal from the first chip to the second chip.

* * * * *